July 13, 1965 W. H. WATSON ETAL 3,195,007

STAGGER-TUNED KLYSTRON WITH CAVITIES RESONANT OUTSIDE PASSBAND

Filed Oct. 28, 1960 3 Sheets-Sheet 1

INVENTORS.
Wilbur H. Watson
Reed E. Holaday

By Clay Holland, Jr.
Attorney

July 13, 1965 W. H. WATSON ETAL 3,195,007

STAGGER-TUNED KLYSTRON WITH CAVITIES RESONANT OUTSIDE PASSBAND

Filed Oct. 28, 1960 3 Sheets-Sheet 2

INVENTORS:
Wilbur H. Watson
Reed E. Holaday
By Clay Holland, Jr.
Attorney

July 13, 1965 W. H. WATSON ETAL 3,195,007

STAGGER-TUNED KLYSTRON WITH CAVITIES RESONANT OUTSIDE PASSBAND

Filed Oct. 28, 1960 3 Sheets-Sheet 3

INVENTORS:
Wilbur H. Watson
Reed E. Holaday

By Clay Holland, Jr
Attorney

United States Patent Office 3,195,007

Patented July 13, 1965

3,195,007
STAGGER-TUNED KLYSTRON WITH CAVITIES RESONANT OUTSIDE PASSBAND

Wilbur H. Watson, Palo Alto, and Reed E. Holaday, Belmont, Calif., assignors to Litton Precision Products, Inc., a corporation of Delaware Filed Oct. 28, 1960, Ser. No. 65,807
6 Claims. (Cl. 315—5.43)

This invention relates to a broadband amplifier and more particularly to a broadband klystron amplifier which is capable of amplifying an input signal over a wide frequency range without the necessity of tuning the resonant circuits of the device while simultaneously providing gain and phase shift characteristics which are substantially flat over the frequency range.

Prior art velocity modulation power amplification tubes, such as multicavity klystrons, for example, have been frequency tuned most successfully by mechanical tuning arrangements. Numerous mechanical devices have been developed for tuning the cavity resonators of klystrons, the most successful of which have functioned to tune the cavity resonators symmetrically about the drift tube axis. Among the tuning mechanisms which fall within this classification are diaphragm tuners which function to vary the internal volume of the cavity, and ring tuners wherein an annular conducting member is positioned concentrically inside the cavity resonator and is moved axially to vary the reactive parameters of the cavity. This latter form of tuning mechanism has been found especially useful for multicavity high power amplifiers, such as those employed as the transmitting klystron tubes in high power radars.

Although mechanical tuners, especially the ring tuners, have been found to perform reasonably well in many applications, they have proven unsatisfactory for many others where continuous wideband amplification capabilities are required. In an effort to overcome the shortcomings in mechanical tuners, considerable development has been conducted to provide continuous broad frequency characteristics, thereby eliminating the need for tuning mechanism. More particularly, the cavity resonators of klystrons have been tuned to different resonance frequencies within the operating frequency band of the device and have been arranged to interact with the electron beam in a preselected complex electrical relationship to provide fixed-tuned broadband operation. This type of fixed-tuned arrangement is commonly known as "stagger" tuning, the term being derived from the fact that the signals produced by the cavities do not add in the same relationship as they do in the conventional cascade amplifier circuit, but add in a predetermined staggered relationship. A cursory review of the stagger tuning technique might lead one to believe that this is a logical technique for providing wideband capabilities. Unfortunately, upon closer evaluation and experimentation, it has been discovered that it is extremely difficult if not impossible, to obtain high gain characteristics, for example 60 db, and a bandwidth in excess of 10 percent in any frequency range which is free of "holes" within the operating band by such a technique. The first disadvantage encountered in stagger tuning arises from the fact that the frequency response of each cavity goes through a 180 degree phase shift within the operating band and in so doing will cause reinforcement or cancellation effects, or both, among the cavities. Consequently, whenever a relatively large number of middle cavities are employed in a klystron, for example five or more cavities, these reinforcement and cancellation effects generally cause holes in the gain versus frequency characteristics and produce non-linearity in the phase versus frequency characteristics of the klystron. A second disadvantage arises from the fact that a drift space of a fraction of a plasma wavelength, for example $0.2\lambda_q$, is required between adjacent cavities along the axis of the tube. Thus, it becomes physically impractical to employ a relatively large number of cavities in the klystron in an attempt to provide the high gain required in many applications.

In accordance with the present invention, it has been discovered that the foregoing and other disadvantages of the prior art stagger tuned klystrons, as well as the mechanically tunable klystrons, may be overcome by utilizing cavity resonators which are characterized by wideband frequency responses, and resonance frequencies which are outside of the operating frequency band of the device. More particularly, in accordance with the present invention, the provision of cavity resonators having wideband frequency response is accomplished by loading the cavities with suitable lossy means which causes the cavities to have a broad frequency response with a resonant frequency close enough to the operating frequency band of the tube, such that the low frequency leading edges or skirts of the frequency response characteristics extend across the operating frequency. In accordance with a further feature of the invention, a klystron is provided which has a relatively high gain versus frequency response, which is unusually flat across the operating frequency band, and also has substantially linear phase shift versus frequency response capabilities.

The tube of the present invention has been designated a "Skirtron" tube, in view of the importance of the overlapping "skirts" or edges of the impedance versus frequency characteristics of the resonant circuits, which figure prominently in the present invention. In order to provide the necessary broad or extended skirts, the resonant circuits have a "Q," indicating the sharpness of tuning, which is relatively low. Thus, as compared with the sharply tuned resonant cavities of conventional klystrons, having Q's of several thousand, the cavities of the present "skirtron" tubes have Q's of less than 500, and preferably below 100, so that broad upper and lower "skirts" or edges of the characteristic are provided. These broad resonant circuits are pretuned to frequencies above and below the desired frequency band of the tube, to produce a flat composite response characteristic for the "skirtron."

In passing, it may be noted that the bandwidths which are contemplated are in the order of 10 percent to 30 percent or more, in the kilo-megacycle frequency range. Accordingly, the peak frequencies of the high and low frequency tuned cavities may be spaced apart by several hundred megacycles.

As is well known, the phase shift produced by a resonant circuit reverses in sign at the resonant frequency; with prior art klystrons in which the cavities are resonant within the amplification band, these reversals in phase produce severe phase distortion and also produce certain cancellations resulting in "holes" or lack of amplification at certain frequencies in the desired amplification band. In accordance with the present invention, in which the cavities are tuned above and below the band, there is little or no phase shift across the bandwidth of the amplifier.

It is, therefore, an object of the invention to provide an amplifier device which is capable of amplifying an input signal over a wide frequency range without the necessity for mechanical tuning adjustments.

Another object of the invention is to provide a high power klystron amplifier in which the resonant circuits are fixed-tuned to predetermined frequencies adjacent the operating frequency band and are broadly tuned to be responsive to an input signal over a wide frequency range, thereby providing a smooth composite gain versus frequency characteristics without holes throughout the operating frequency band.

A further object of the invention is to provide a klystron amplifier which employs a plurality of fixed-tuned or pretuned cavity resonators having preselected impedance characteristics responsive to an input signal over a frequency band of at least 30 percent of the center frequency of the operating band and which are capable of providing substantially linear phase shift versus frequency characteristics over the entire frequency band.

Still another object of this invention is to provide a high power klystron which employs a plurality of fixed-tuned cavity resonators having preselected impedance characteristics capable of providing broadband frequency responses therefor wherein the resonance frequency of said cavities is outside the operating frequency band and at least one of the edges of each of their response curves extends across the operating band.

The novel features which are believed to be characteristic of the invention, both as to its organization and method of operation, together with the further objects and advantages thereof, will be better understood from the following description considered in connection with the accompanying drawings in which several embodiments of the invention are illustrated by way of example. It is to be expressly understood however, that the drawings are intended for the purpose of illustration and description only, and are not intended as a definition of the limits of the invention.

Figures 3, 4, 5, 7:
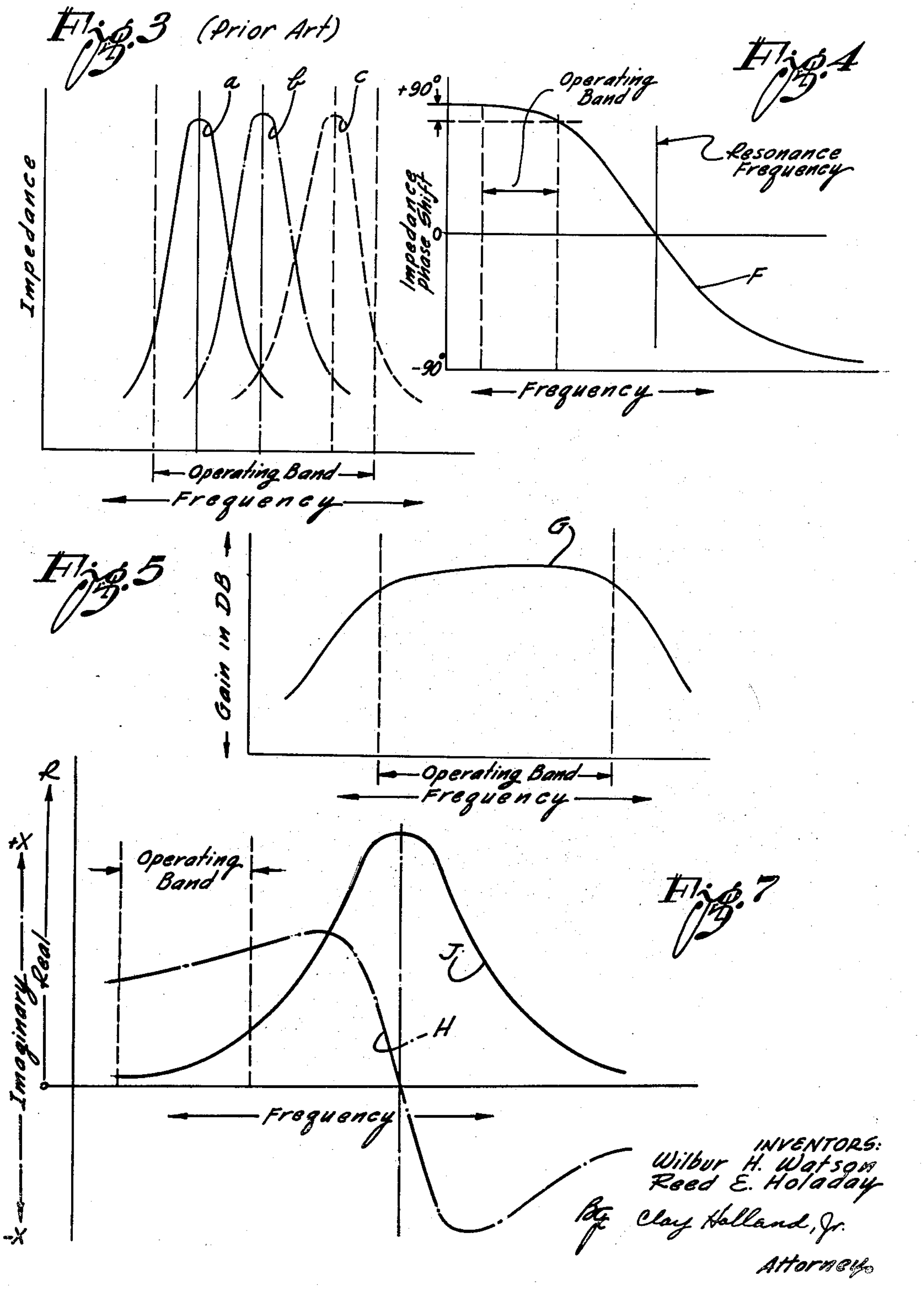
FIGURE 3 illustrates a typical plot of frequency response curves for three cavity resonators of the prior art stagger tuned arrangement which are sharply tuned to their resonance frequencies within the operating frequency band.
FIGURE 4 is a typical plot of impedance phase shift versus frequency response, illustrating the manner in which the phase angle of the gap impedance of one of the intermediary cavities varies across the operating frequency band.
FIGURE 5 illustrates a typical plot of power gain versus frequency response for the combination of resonant circuits shown in FIGURE 1.
Figure 6A:
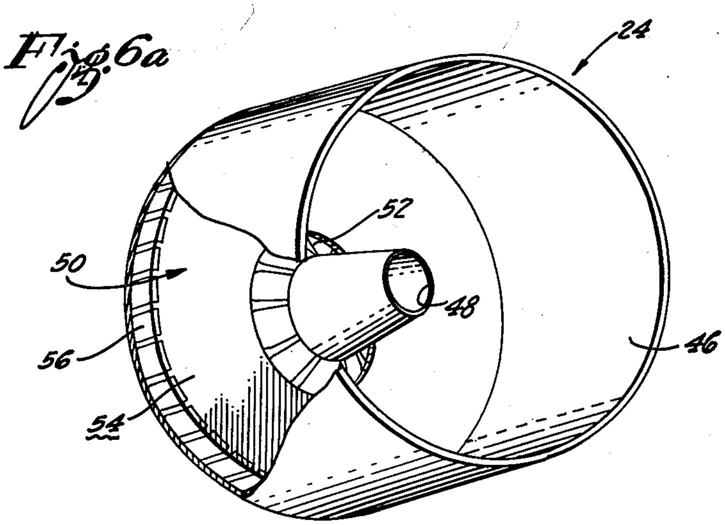
Figure 6B:
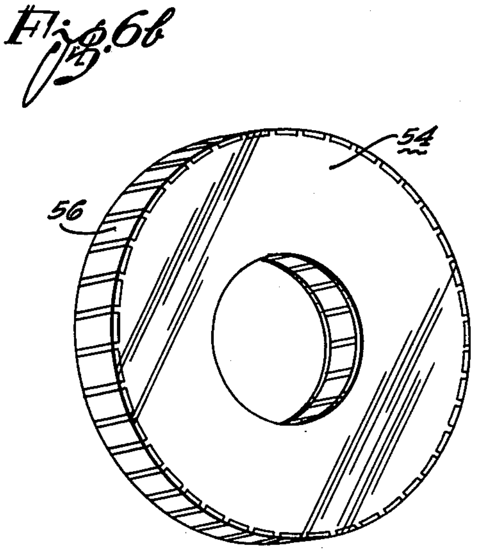
Figure 6C:
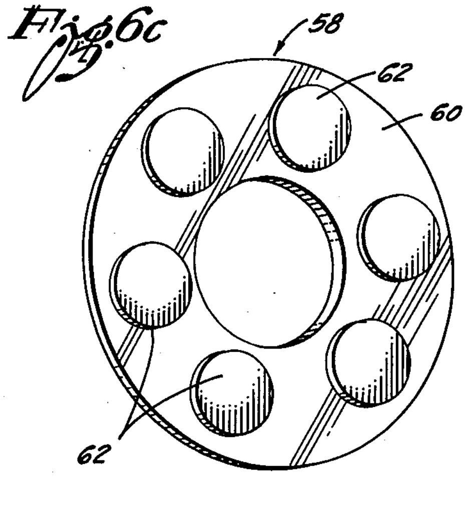

FIGURE 6*a* is an isometric view, partly in cross-section, at one-half of a typical loaded cavity resonator employed in a high power klystron amplifier of the present invention to provide wideband operation;

FIGURE 6*b* shows one of the elements which forms the lossy dielectric element of the cavity structure shown in FIGURE 6*a*;

FIGURE 6*c* is an alternative configuration for the lossy element shown in FIGURE 6*b* and may be substituted therefor in the structure of FIGURE 6*a*; and FIGURE 7 is a typical plot of impedance locus of a parallel resonance circuit illustrating the degree of variations in the imaginary and real components of the impedance as viewed from the cavity gap.

Figure 1:
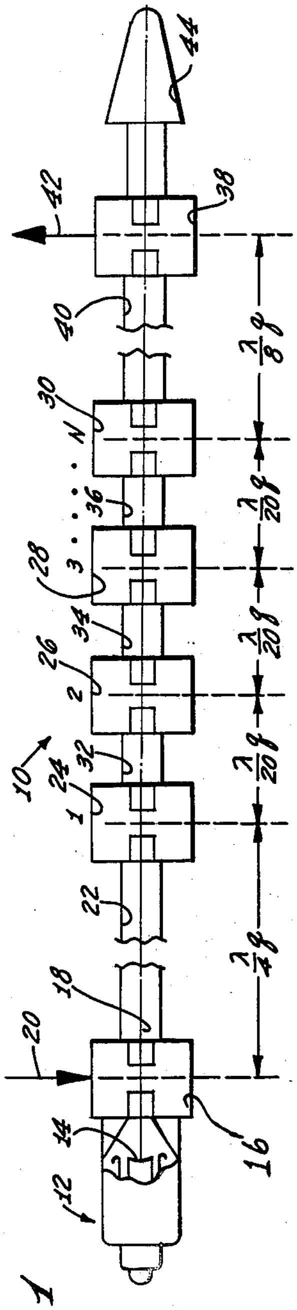
FIGURE 1 is a diagrammatic cross-sectional view of a klystron amplifier tube illustrating the manner in which the input and output cavity resonators may be arranged with respect to the N-number intermediary cavities to provide broadband characteristics for high power operation, in accordance with the invention.

With reference now to the drawings, wherein like or corresponding parts are designated by the same reference characters throughout the several views, there is shown in FIGURE 1 a high power klystron amplifier, generally designated 10, of the "Skirtron" type, as described above. As shown in FIGURE 1, klystron 10 comprises basically an electron gun section, generally designated 12, having a cathode 14 for producing an electron beam, an input buncher cavity resonator 16 disposed adjacent said gun section aligned along the axis of the tube designating a path 18 of said electron beam emitted by said cathode. The input resonator has an input means 20 associated therewith for coupling a signal into the amplifier and which may also be employed in part for loading the input resonator in a preselected manner. Continuing, a first drift tube 22 is affixed at one end to the end wall of input resonator farthest from the cathode and at the other end to the first of a plurality of fixed tuned resonator circuits, designated 24. Each successive N-following resonator 26, 28, and 30, respectively, is connected in alignment along the axis and separated by drift tubes 32, 34, and 36, respectively, and cavity 30 is connected to an output resonant circuit 38 through a final drift 40. The output resonator 38 has an associated output means 42 which is utilized to couple energy from the amplifier. The amplifier device is completed by a collector electrode 44 which is connected to cavity 38 in axial alignment therewith providing means for collecting the electrons of the electron stream and dissipating the energy generated thereby.

Considering now with particularity to the characteristics of the gap impedance of the cavity resonators and the manner in which they are arranged to provide broadband operation, FIGURE 1 illustrates one arrangement which has been found to operate satisfactorily in accordance with the teachings of the invention. As shown in FIGURE 1, input cavity 16 may be disposed a fraction of a plasma wavelength in space relationship to the first intermediary resonator 24, for example $\lambda_q/4$, while the spacing between each of the intermediary resonators 24, 26, 28, and 30 respectively, is, for example, $\lambda_q/20$, and the output resonator 38 is disposed $\lambda_q/8$ from the last of the intermediary resonators. It is important to note at this point that the close spacing of the intermediary resonators permits a large number of resonant circuits to be utilized as the intermediary section of the amplifier, thereby insuring higher power gain in the device while also providing broader bandwidth capabilities than have heretofore been known in similar prior art devices.

Figure 2:
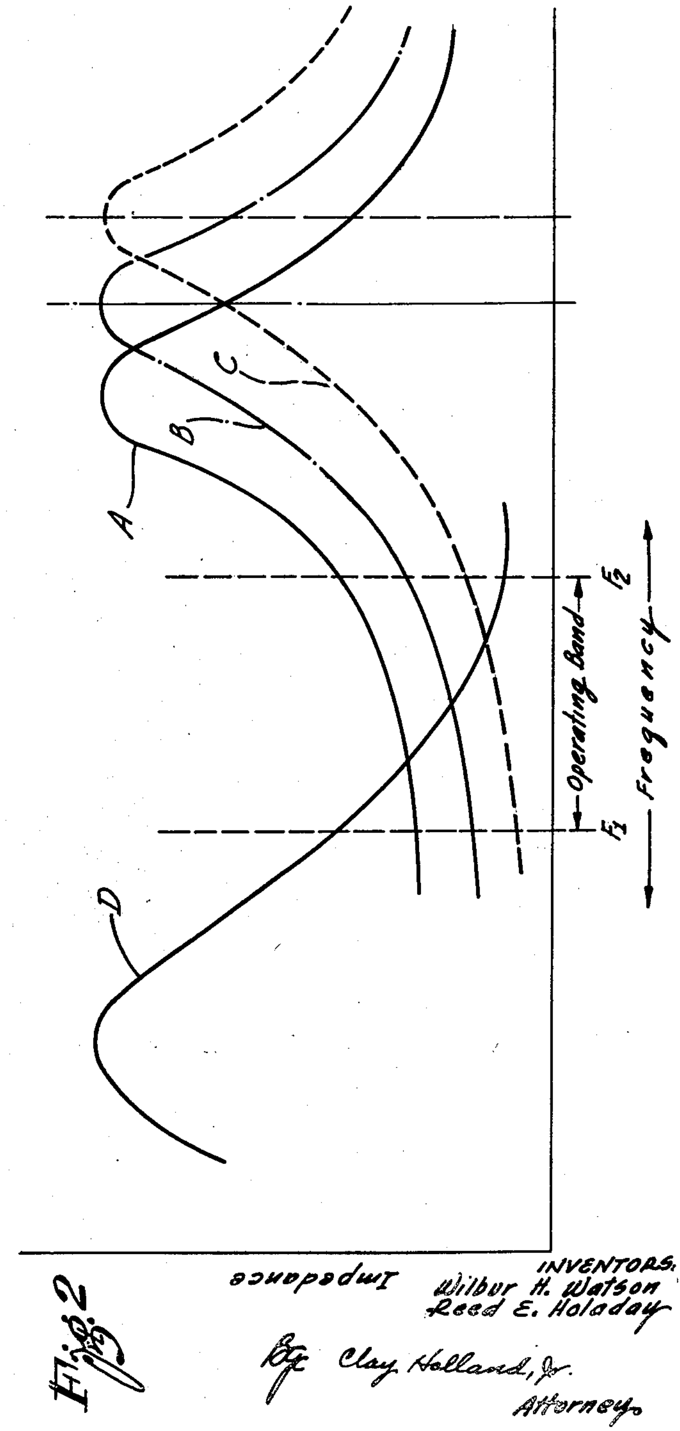
FIGURE 2 illustrates a typical plot of the broad frequency response curves of cavity resonators tuned to different resonant frequencies outside the operating frequency band, in the klystrons of the present invention.

In addition to being closely spaced, the intermediary cavity resonators are different in impedance characteristics and fixed tuned at their resonance frequency such that there is a preselected frequency separation between adjacent cavities. A plurality of curves A, B, and C shown in FIGURE 2 illustrates typical response curves for the first, second and third intermediary cavities, respectively, of FIGURE 1, and FIGURE 2 also indicates the manner in which they are tuned away from the operating frequency band. FIGURE 2 also shows a response curve D for the input resonant circuit and illustrates the manner in which the trailing skirt or edge of the input curve D overlaps the leading skirts of curves A, B, and C within the operating frequency band. It should be noted at this point that the cavities shown in FIGURE 1 are purposefully made to have wider frequency responses than that customarily utilized in prior art klystrons, the details of how the broadbanding is accomplished will be discussed in greater detail hereinafter.

A great appreciation of the manner in which the intermediary cavities are tuned with respect to the operating frequency may be had by referring to FIGURE 3, which illustrates the prior art technique of stagger tuning with three cavities. It can be seen from the drawing that the cavity resonators are fixed-tuned within the operating frequency band, as opposed to their being fixed-tuned to frequencies outside the band as taught by present invention, and furthermore, it will be noted that the prior art devices did not operate in a region which is solely representative of the skirts of the response curves as is the case in the present invention. Moreover, since all of the cavities are turned to frequencies within the operating frequency band, their gap impedance phase shifts may cancel one another within the band. In contrast to this, FIGURE 2 illustrates that the resonance frequencies of the intermediary cavities are outside of the operating band and the leading edges or skirts extend across the operating band, and thus the phase shift characteristics do not have the cancelling effect on one another found in the prior art stagger tuned arrangements.

In operation, the electron beam is emitted from the cathode and focused along the path 18, through the aid of a solenoidal magnetic field produced by an associated magnet, which has not been shown. An input signal to be amplified is applied to the device through the use of input means 20 in a predetermined manner to establish initial electric fields within the input cavity, whereby the electron beam is initially velocity modulated by the fields as it passes through the interaction gap of the input cavity 16, and then leaves the input cavity and passes into the drift tube 22 en route to the intermediary cavities. As the electron beam passes through the intermediary cavity resonators, it interacts with the gap impedance of each cavity, in a complex manner which is well known to those versed in the stagger tuned klystron art.

Referring to FIGURE 4, there is shown a typical plot of the gap impedance phase shift versus frequency characteristic of an individual intermediary cavity, generally designated F which illustrates by the pair of arrows at the upper left of FIGURE 4 the relatively small variation in phase of the gap impedance within the operating frequency. Since each of the intermediary cavities has a characteristic which may be represented by FIGURE 4, and the characteristic of the input cavity is complementary to that of FIGURE 4 in the operating band, it will be appreciated by those versed in the klystron art that the slight phase shift presented to the electron beam by each cavity produces a composite phase shift versus frequency response within the operating frequency band which is substantially linear.

Continuing with the description of the operation of the amplifier, the electron beam passes through the last intermediary cavity 30, having been modulated by the individual gap voltages of the cavities, into the output cavity where energy is extracted from the bunched electron beam and transmitted to an external load through the use of the output coupling structure indicated by arrow 42. The output cavity is a broadband structure, with a relatively low Q, preferably lower than that of the input or intermediary cavities. After passing through the output cavity and giving up most of its energy therein, the electron beam continues along the axis of the tube to the collector electrode 44 where it is collected and the heat generated by it is dissipated by suitable cooling means which has not been shown.

Referring now to FIGURE 5, a curve G illustrates the relative power gain versus frequency response of a typical high power klystron amplifier, for example a 100 kilowatt average output tube having 60 db gain, in accordance with the teachings of the invention. More particularly, the gain is unusually flat across the entire operating frequency band, without any evidence of holes as is experienced in the prior art tubes.

Referring now to FIGURE 6*a*, there is shown an isometric view, partly in cross-section of one-half of one of the types of cavity resonators which may be utilized as the intermediary cavity 24, 26, 28, or 30 in FIGURE 1. FIGURE 6*a* illustrates the construction and the manner in which they may be loaded to broaden the frequency response to a greater extent than is customary in the klystron amplifiers of the prior art. More particularly, for example, cavity 24 comprises a conventional cylindrical cup 46 having a gap nose 48 disposed concentrically with respect to the cylindrical wall of the cup, a lossy element, generally designated 50, and a retaining ring 52 which is a good electrical and heat conductor, for holding the element 50 within said cup.

Continuing with the description of the cavity resonator, with reference to FIGURE 6*b* there is shown the lossy element which consists of a disc of sintered ceramic-metallic material 54, such as aluminum oxide with metallic additives of powdered iron or nickel or both, which has excellent heat conducting properties, and is disposed in a flat cylindrical retaining cup 56 made of a good electric and heat conductor, for example copper, to which the ceramic is affixed as by brazing. The lossy element is affixed to the bottom of cavity cup 46 by means such as brazing or the like, and ring 52.

In FIGURE 6*c* there is shown an alternative form of lossy element, generally designated 58, consisting of a flat washer 60 of good heat and electrical properties, such as copper for example, and a plurality of ceramic elements 62 in the form of circular wafers. However, it is to be understood that the ceramic wafers in this embodiment may have another configuration other than that shown in the drawing.

The technique for loading the cavities has been described with respect to utilizing a bulk loss means. Although it is an essential requirement for the successful operation of the amplifier that the input and the intermediary cavities are heavily loaded to produce a pronounced skirt to the frequency response, the input cavity may be loaded by the input circuit, while the intermediary cavities may be loaded externally, or may be loaded internally by either surface or bulk loss means or both.

In operation both the input and intermediary cavities exhibit wide frequency responses having skirts which overlap each other within the operating frequency band. Referring to FIGURE 7 there is shown a plot of gap impedance versus frequency resonance curve illustrating the imaginary characteristic component, curve H, and the real characteristic component, curve J, of the intermediary cavities. It should be noted from the drawing that the real or resistive component of the cavities impedance is relatively small in comparison to the imaginary or reactive component. From the curves it becomes apparent that the gap voltage ($Vg$) of the cavity resonators is equal to the product of the complex current ($Ib$) and the shunt reactance ($Xsh$) which is an appreciable quantity, while the power loss which is the product of current $(Ib)^2$ and the resistance (R) is small. Consequently, the addition of the loss material to the cavities flattens the frequency response characteristic while causing only negligible loss in power due to $I^2R$ losses.

With regard to the loading of the input, the intermediary, and the output cavities, it is again noted that the Q of the cavities should be much less than that of prior art klystrons. Thus, for example, where Q's of several thousand are commonly employed in prior art klystrons, the cavities of the present skirtron tubes are loaded to have Q's below 500, and preferably below 100. In general, the Q of the cavities will depend on the desired bandwidth, with lower Q's being required for wider bandwidths. In the example illustrated in FIGURE 2, where the input cavity is turned beyond one side of the operating band and several intermediary cavities are tuned beyond the other side, the Q's of each of the intermediary cavities would be lower, perhaps one-half that of the Q of the input cavity. Thus, where the input cavity preferably has a Q below 100, the intermediary cavities may have Q's below 50.

The advantages derived from the use of the novel broadbanding technique in accordance with the teachings of the invention as described hereinabove will now be considered. Firstly, owing to the fact that the resonant circuits of the amplifier are loaded to provide low Q circuits, having frequency response ranges substantially wider than that of any circuits heretofore thought to be required for stagger tuned applications in high power klystron amplifiers, it is possible to produce an amplifier which is fixed-tuned capable of producing substantially uniform amplification of an input signal over a wide frequency range, for example 30 percent or more at L-band as compared with 5 percent for prior art devices. In addition, since each of the intermediary resonant circuits is tuned to its resonance frequency outside of the operating frequency range with its leading skirt extending across the operating band, it is possible to provide a device having no cancelling effects between the cooperating cavities. This permits cumulative additive action by the cavities to provide a gain versus frequency characteristic which has no holes across the operating band.

Another advantage arises from the fact that the input and the intermediary cavity resonators of the amplifier are fixed-tuned or pre-tuned to operate at a frequency such that a preselected portion of the leading skirts of the frequency response extend into the operating frequency range of the amplifier at a point in the response characteristic of each cavity where the variation in phase shift is very small. Thus a system which is dependent upon substantial linearity in phase shift versus frequency may employ such an amplifier in accordance with the present invention, thereby avoiding the drastic variations in phase shift inherently characteristic of prior stagger tuned klystrons.

Still another advantage arises from the fact that the intermediary cavity resonators are physically disposed in relatively close spaced relationship to one another, for example, one-twentieth of a plasma wavelength, as compared to the spacing between adjacent cavities of the prior art klystron amplifiers. Consequently, the relatively close spacing between the intermediary cavities enables one to produce an amplifier with a sufficient number of intermediary cavities to insure enhanced electron bunching and thereby avoid having the relatively long tube required by the longer drift tubes of the prior art klystrons. Finally, it will be recalled that the lossy elements introduced into the cavity resonators lower the Q thereof for broadbanding purposes and in addition provide a resistance characteristic. This resistance stabilizes the operation of "skirtron," and, surprisingly, does not introduce a significant amount of loss into the device.

While the klystron amplifier of the invention has been described with reference to one embodiment, it will be understood that various modifications could be made in the construction or arrangement thereof without departing from the spirit and scope of the invention. Thus, by way of example, but not of limitation, the drift tube lengths may be varied in length in accordance with principles known to those skilled in the art, and other forms of loaded resonant circuits may be employed. Accordingly, it is to be expressly understood that the foregoing description shall be interpreted only as illustrative of the invention, and that the appended claims be accorded as broad an interpretation as is consistent with the basic concept herein taught.

What is claimed as new is:

1. In a klystron amplifier tube of the velocity modulation type for amplifying an input signal over a wide operating frequency band with high power handling capabilities within the frequency band, said tube having a predetermined axis and comprising: means for producing a beam of electrons along said axis of said tube, means for velocity modulating said beam, an electrode for collecting the electrons in said beam, drift tube means surrounding the path of said electron beam after said beam has been modulated, and a plurality of resonant circuits coupled to said drift tube means, each of said circuits having a different resonant frequency above the operating frequency band, said circuits having a frequency response characteristic a portion of which extends across the operating frequency band of the tube.

2. In an amplifier tube of the velocity modulation type for amplifying an input signal over a wide operating frequency band with substantially linear phase shift versus frequency response capabilities within the operating band, said tube having a predetermined axis and comprising:

means for producing a beam of electrons along said axis of said tube, means for velocity modulating said beam, an electrode for collecting the electrons in said beam, drift tube means surrounding the path of said electron beam after said beam has been velocity modulated, an input and output circuit, and a plurality of cavity resonators each having different resonance frequencies, each of said cavities being tuned to its respective resonance frequency and being physically disposed a predetermined fraction of a plasma wavelength with respect to one another and to said input and output circuits, said respective resonance frequencies being outside the operating frequency band, said circuits having a wide frequency response including frequencies in the operating frequency band.

3. In multicavity klystron tube having a predetermined axis, the combinations comprising: an electron means for producing a beam of electrons along said axis of said tube, input means for velocity modulating said beam disposed adjacent said electron means and along said axis, drift tube means surrounding the path of said electron beam after said beam has been modulated, an output circuit for coupling microwave energy from said electron beam to an external load, an electrode for receiving electrons in said beam, and a plurality of intermediary cavity resonators, disposed between said input means and output circuit, having a resonance frequency outside the operating frequency band and including loading means to provide a wide frequency response on either side of the resonance frequency of said cavities, a portion of said frequency response being relatively constant and extending across the operating frequency band.

4. A multicavity klystron tube having a predetermined axis, the combination comprising: electron means for producing a beam of electrons along said axis of said tube, input means for velocity modulating said beam disposed adjacent said electron means and along said axis, drift tube means surrounding the path of said electron beam after said beam has been modulated, an output circuit for coupling microwave energy from said electron beam to an external load, an electrode for receiving electrons in said beam, and a plurality of intermediary resonant circuits each having a different characteristic impedance providing different resonance frequencies for each outside the operating frequency band of the tube and a frequency response for each which includes frequencies within the operating frequency band, said plurality of intermediary cavities being disposed along the axis of the tube wherein they are in a predetermined phase relationship with one another to provide a broadband operation of said tube.

5. The tube defined in claim 4 wherein said resonant circuits are fixed-tuned to their respective resonance frequencies.

6. A high power amplifier tube of the velocity modulation type for amplifying an input signal over a wide operating frequency band, said tube having a predetermined axis and comprising: means for producing a beam of electrons along said axis of said tube; an input resonant cavity disposed to receive said electron beam and impose thereon a radio frequency input signal to velocity modulate said beam, said input cavity including means to present a substantially capacitive reactance to said beam for all frequencies within said operating frequency band; and a plurality of intermediary resonant cavities disposed to receive said modulated beam, each of said intermediary cavities including means to present a substantially inductive reactance to said beam for all frequencies within said operating frequency band.

References Cited by the Examiner

UNITED STATES PATENTS

| | | | |
|---|---|---|---|
| 2,579,480 | 12/51 | Feenberg | 315—5.39 X |
| 2,910,613 | 10/59 | Badger | 315—5.39 X |

(Other references on following page)

UNITED STATES PATENTS

| | | | |
|---|---|---|---|
| 2,958,804 | 11/60 | Badger et al. | 315—5.51 X |
| 3,028,519 | 4/62 | Jepsen et al. | 315—5.43 |

OTHER REFERENCES

Beaver et al.: I.R.E. Wescon Convention Record, vol. 3, part 3, Aug. 18–21, 1959, pages 103 to 111 incl.

Goldman et al.: I.R.E. National Convention Record, vol. 6, part 3, 1958, pages 114 to 123 incl.

Kreuchen et al.: Journal of Electronics, vol. 2 (July 1956–May 1957), pages 529 to 567, page 553 cited.

GEORGE N. WESTBY, *Primary Examiner.*

MAYNARD R. WILBUR, ROBERT SEGAL, *Examiners.*